United States Patent [19]

Suzumura et al.

[11] Patent Number: 5,177,029

[45] Date of Patent: Jan. 5, 1993

[54] METHOD FOR MANUFACTURING STATIC INDUCTION TYPE SEMICONDUCTOR DEVICE ENHANCEMENT MODE POWER

[75] Inventors: Masahiko Suzumura, Ibaraki; Kazushi Kataoka, Osaka; Takuya Komoda, Sanda, all of Japan

[73] Assignee: Matsushita Electric Works, Ltd., Osaka, Japan

[21] Appl. No.: 767,574

[22] Filed: Sep. 30, 1991

Related U.S. Application Data

[63] Continuation of Ser. No. 495,434, Mar. 19, 1990, abandoned.

[30] Foreign Application Priority Data

Mar. 28, 1989 [JP] Japan .................................. 1-76009

[51] Int. Cl.⁵ .......................................... H01L 21/266
[52] U.S. Cl. ..................................... 437/41; 437/149; 437/911
[58] Field of Search .............. 437/911, 41, 952, 979, 437/960, 946, 148, 149; 357/22; 148/DIG. 38, DIG. 78

[56] References Cited

U.S. PATENT DOCUMENTS

| 4,158,783 | 6/1979 | Berger et al. ............... 148/DIG. 38 |
| 4,551,909 | 11/1985 | Cogan et al. .......................... 437/911 |
| 4,708,904 | 11/1987 | Shimizu et al. ................. 204/192.34 |
| 4,811,064 | 3/1989 | Nishizawa et al. .................... 357/22 |
| 4,889,826 | 12/1989 | Ohta .................................... 437/911 |

FOREIGN PATENT DOCUMENTS

54-92180 7/1979 Japan .
60-955 8/1979 Japan .
56-71979 6/1981 Japan .

OTHER PUBLICATIONS

Wolf et al., "Silicon Processing for the VLSI Era, vol. 1", pp. 213-215, 264, 280-282, 303-307, 520; 1986.

Primary Examiner—Brian E. Hearn
Assistant Examiner—C. Chaudhari
Attorney, Agent, or Firm—Burns, Doane, Swecker & Mathis

[57] ABSTRACT

A method for manufacturing a static induction type semiconductor device is to form gate zones on a surface side of a semiconductor substrate, to cover the surface including the gate zones with an oxide film, to form through the oxide film apertures for providing cathode zones in the substrate, the apertures respectively overlapping partly each gate zone, and to form the cathode zones with thermal diffusion of an impurity carried out through the apertures, the cathode zones thus partly overlapping the gate zones. Concentration of the impurity as well as the depth of the diffusion at thus made impurity diffusion zones can be thereby stabilized, and eventually electric characteristics of enhancement type, static induction type semiconductor device can be sufficiently made stable.

2 Claims, 4 Drawing Sheets

METHOD FOR MANUFACTURING STATIC INDUCTION TYPE SEMICONDUCTOR DEVICE ENHANCEMENT MODE POWER

This application is a continuation of application Ser. No. 07/495,434, filed Mar. 19, 1990, now abandoned.

BACKGROUND OF THE INVENTION

This invention relates to a method for manufacturing static induction type semiconductor device and thereby manufactured semiconductor devices.

The static induction type semiconductor device of the kind referred to may be effectively utilized in a circuit which employs, for example, an enhancement type semiconductor device.

DESCRIPTION OF THE RELATED ART

An example of the static induction type semiconductor device of the kind referred to has been disclosed in Japanese Patent Application Laid-Open Publication No. 54-92180 by S. Iwanai, according to which a mesa etching is carried out with a selective oxidation of a surface of semiconductor substrate to form therein gates, and conductive silicon crystals are made to adhere by means of CVD method or the like to surface parts to be made as drains. With this known device, however, there is a problem that the electric characteristics have been unstable due to that the depth of drain zones or fluctuation in sheet resistance is too much. That is, such impurity profile as the impurity concentration and diffusion depth are likely to be made not stable nor uniform upon the adhesion of the conductive silicon crystal onto the surface of the semiconductor substrate and its thermal diffusion into the substrate.

In the foregoing static induction type semiconductor, the withstand voltage characteristics between the gate and drain are relying on the distance from drain forming position and the impurity concentration, in particular, of conjugated portion between heterogenous impurity zones, but there has been a problem that such distance and concentration are caused to fluctuate due to the unstable impurity profile so as to render the withstand voltage between the gate and drain unstable. Further in the foregoing static induction type semiconductor device, the gate threshold voltage relies on the channel width between the impurity diffusion zones as the gate zones so that, in the one of enhancement type, the channel width is desired to be made as small as possible, whereas the problem due to the unstable impurity profile is made remarkable as the channel width is made smaller.

Further static induction type semiconductor devices are disclosed in Japanese Patent Publication No. 60-955 of Y. Gyomoto, Japanese Patent Application Laid-Open Publication No. 56-71979 of H. Ikoma and so on, but they are still not of a level beyond the foregoing device of S. Iwanai, without solving the problem involved in the known art.

SUMMARY OF THE INVENTION

A primary object of the present invention is to provide a method for manufacturing an enhancement type, static induction type semiconductor device and the thereby manufactured semiconductor device, in which device such impurity profile as the impurity concentration and diffusion depth can be made substantially uniform so that the withstand voltage characteristics between the gate and cathode can be stabilized and the channel width can be sufficiently made smaller to be utilized as the enhancement type so as to be able to optimumly set the gate threshold voltage.

According to the present invention, the above object is realized by a method for manufacturing an enhancement type, static induction type semiconductor device in which impurity diffusion zones constituting gate zones are formed on a surface side of a semiconductor substrate, further impurity zones constituting cathode zones are formed also on the surface side of the semiconductor substrate, gate electrodes are formed on the impurity diffusion zones constituting the gate zones, cathode electrodes are formed on the impurity diffusion zones constituting the cathode zones, and an anode electrode is formed on an impurity diffusion zone formed on a reverse side of the substrate to constitute an anode zone, characterized in that the impurity diffusion zones constituting the cathode zones are formed in such that an oxide film is provided to cover the surface side of the substrate on which the impurity diffusion zones constituting the gate zones are formed, apertures for providing the impurity diffusion zones constituting the cathode zones are provided in the oxide film, the impurity diffusion zones constituting the cathode zones are formed by means of a thermal diffusion of an impurity as led through the apertures into the surface side so that the cathode zones will partly overlap the impurity diffusion zones constituting the gate zones, a thin oxide film is provided within the apertures, and the cathode electrodes are formed through an etching carried out to selectively remove the thin oxide film in the apertures.

According to the foregoing method for manufacturing the static induction type semiconductor device, the fluctuation in the impurity concentration or the depth of diffusion can be minimized by the impurity diffusion zones constituting the cathode zones are so formed as to partly overlap the impurity diffusion zones constituting the gate zones, whereby the impurity profile can be stabilized so that the electric characteristics can be effectively made stable even when the channel width between the respective impurity diffusion zones constituting the gate zones are made smaller.

Other objects and advantages of the present invention will become clear from following description of the invention detailed with reference to accompanying drawings.

While the present invention shall now be described with reference to embodiments shown in the accompanying drawings, it should be appreciated that the intention is not to limit the invention only to such embodiments shown but to rather include all alterations, modifications and equivalent arrangements possible within the scope of appended claims.

DETAILED DESCRIPTION OF THE PREFERRED EMBODIMENTS

Figure 1A:
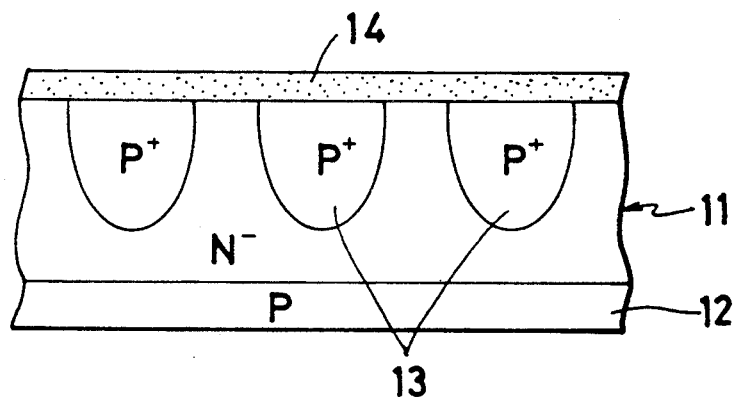
FIGS. 1a through 1g are diagrams for explaining the sequence of basic steps forming the method for manufacturing the static induction type semiconductor device according to the present invention.
Figure 1B:
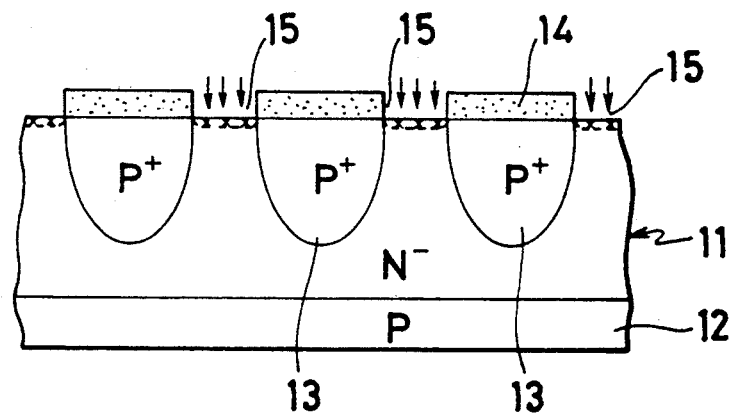
Figure 1C:
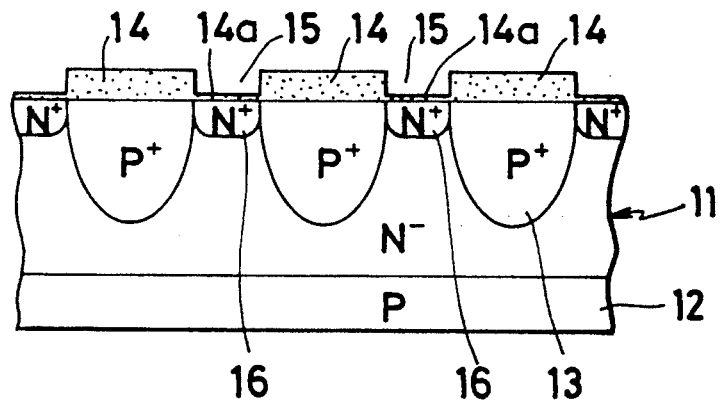

Referring to FIGS. 1a through 1g, there are shown here basic steps of the method for manufacturing a surface gate type static induction thyristor as the static induction type semiconductor device according to the present invention. In the present instance, as shown in FIG. 1a, an $N^-$-type silicon semiconductor substrate 11 is provided with a P-type impurity diffusion zone 12 constituting an anode zone formed on a reverse side of the substrate, and with $P^+$-type impurity diffusion zones 13 constituting gate zones formed on the other surface side of the substrate 11, and an oxide film 14 is further formed to cover the surface side over the zones 13. Next, as in FIG. 1b, ion-implanting apertures 15 are made through the oxide film 14 so that the apertures 15 will expose the surface of the substrate 11 between the adjacent $P^+$-type impurity diffusion zones 13 while partly overlapping the zones 13, such N-type impurity as phosphor is introduced into the exposed surface of the substrate, and the introduced impurity is subjected to a thermal diffusion and activation within an atomosphere of $N_2$ gas. Consequently, as in FIG. 1c, $N^+$-type impurity diffusion zones 16 constituting cathode zones are formed so as to be provided with a reverse directional junction withstand voltage with respect to the $P^+$-type impurity diffusion zones 13 constituting the gate zones, and thereafter the apertures 15 are closed by a thin oxide film 14a formed to be about several hundred Å to cover the zones 16. That is, in the event where the substrate is subjected to the thermal diffusion in the $N_2$ gas atmosphere, a very thin, natural oxide film is to be formed inside the apertures 15. In the present instance, the ion implantation is employed for leading the impurity into the apertures 15 for forming the cathode zones, but any other process, for example, a deposition process with $POCl_3$ which is a liquid source may be employed.

Figure 1D:
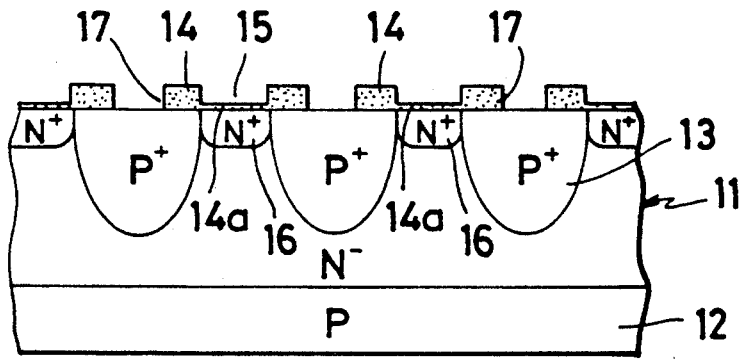
Figure 1E:
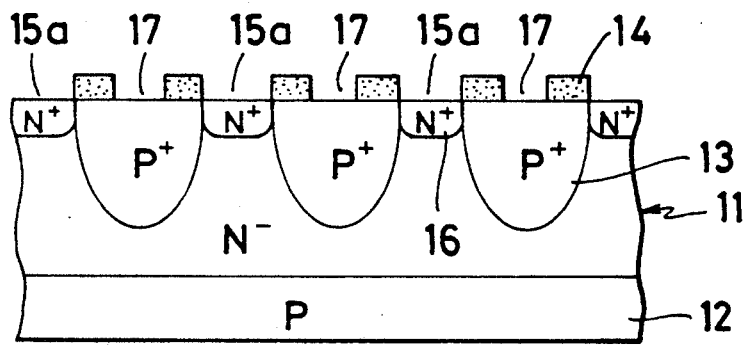

As shown in FIG. 1d, next, contact apertures 17 for making gate electrodes are made through the oxide film 14 on the surface side of the silicon semiconductor substrate 11 to partly expose the $P^+$-type impurity diffusion zones 13, preferably by means of an etching carried out with a photomasking provided on the film 14. Since the $P^+$-type impurity diffusion zones 13 constituting the gate zones have been formed to be diffused to a relatively large depth into the $N^-$-type semiconductor substrate 11 and to have a relatively large widthwise dimension on the surface side of the substrate 11, the formation of the contact apertures 17 in the oxide film 14 above the respective zones 13 can be carried out very easily with a certain dimensional allowance. After such formation of the apertures 17, the thin oxide film 14a formed in the apertures 15 is removed at selective positions so as to form contact apertures 15a for making cathode electrodes. In this case, it may be possible to form the contact apertures 15a only by means of a slight etching without carrying out the photomasking with respect to the thin oxide film 14a. It is possible to reach a state as shown in FIG. 1e where both of the contact apertures 17 for providing the gate electrodes and the contact apertures 15a for providing the cathode electrodes to the semiconductor substrate 11 are formed, with the slight etching performed, for example, for about 30 seconds with a solution of $HF:H_2O = 1:10$. The foregoing ion-implanting apertures 15 as well as the contact apertures 15a for providing the cathode electrodes may be formed practically in the same manner.

Figure 1F:
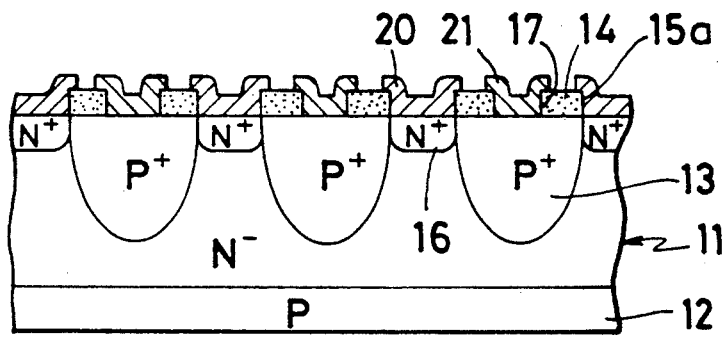
Figure 1G:
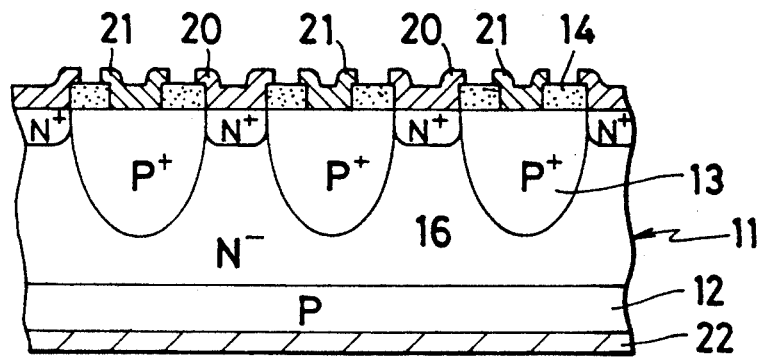

Then, as shown in FIG. 1f, cathode electrodes 20 and gate electrodes 21 respectively of aluminum are concurrently formed. Further, as shown in FIG. 1g, an anode electrode 22 is formed on the P-type impurity zone 12 on the reverse side of the semiconductor substrate 11, and the surface gate type static induction thyristor can be thereby completed. Here, the oxide film 14 is to constitute an insulating layer. It will be readily appreciated that, in the static induction thyristor prepared through the foregoing manufacturing steps, the amount of electric current flowing through a high specific resistance zone, i.e., a base zone which the silicon semiconductor substrate 11 can be controlled by adjusting a voltage applied to the gate electrodes 21. Further, while the contact apertures 17 for providing the gate electrodes have been referred to as being formed prior to the contact apertures 15 for providing the cathode electrodes in the foregoing manufacturing steps according to the present invention, these contact apertures 17 may of course be formed after the formation of the contact apertures 15a for providing the cathode electrodes.

Figure 2A:
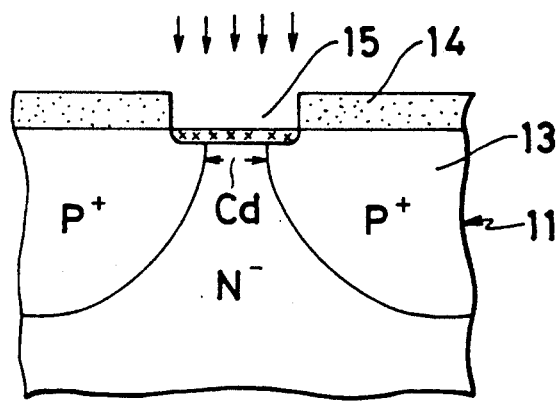
FIGS. 2a to 2c are diagrams for explaining with a fragmental relevant part of the device the sequence of steps for rendering the static induction type semiconductor device to be of an enhancement type according to the method of the present invention.
Figure 2B:
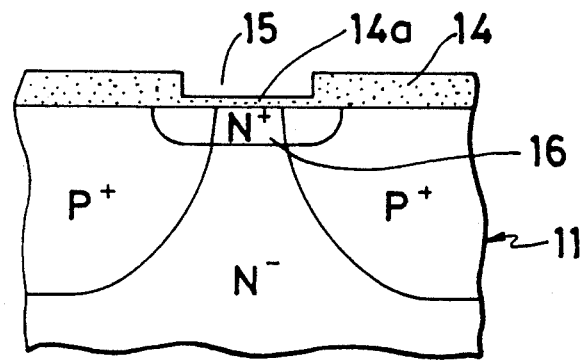
Figure 2C:
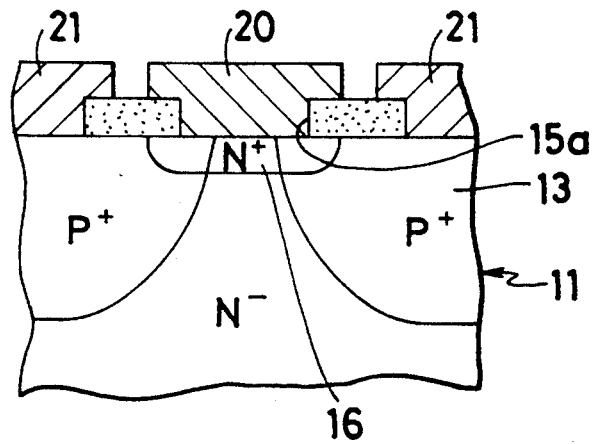

Referring next to FIGS. 2a through 2c, there are shown main steps in a more concrete method for manufacturing the static induction thyristor of the enhancement type according to the present invention. In the enhancement type static induction thyristor, in particular, a relatively large current capacity is demanded so that the ion-implanting apertures 15 for forming the cathode zones are required to be provided wider, whereas the channel width Cd between adjacent ones of the impurity diffusion zones 13 constituting the gate zones is demanded to be of the minimum value, so that the arrangement will be such that the area of each aperture 15 for making the cathode zone overlaps partly adjacent ones of the impurity diffusion zones 13 constituting the gate zones. In this event, the manufacturing steps themselves may be the same as those of FIGS. 1a through 1g, but the ion-implanting apertures 15 are to be made in obtaining the enhancement type thyristor, in practice, so that each ion-implanting aperture 15 is made to partly overlap the adjacent ones of the impurity diffusion zones 13 formed as the gate zones with the channel width Cd made relatively narrower so as to expose mutually opposing corner portions of the zones 13, as seen in FIG. 2a. The ion-implanting is then carried out through the apertures 15 with such N-type impurity as phosphor, the thermal diffusion of the implanted ions and their activation are carried out in the $N_2$ gas atmosphere, and the $N^+$-type impurity diffusion zones 16 for forming the cathode zones are thereby formed, as shown in FIG. 2b, in which event the impurity diffusion zones 16 constituting the cathode zones are formed so as to partly overlap corner or edge portions of the impurity diffusion zones 13 constituting the gate zones. The impurity diffusion zones 16 constituting the cathode zones may be formed by means of the foregoing deposition process.

Figure 3:
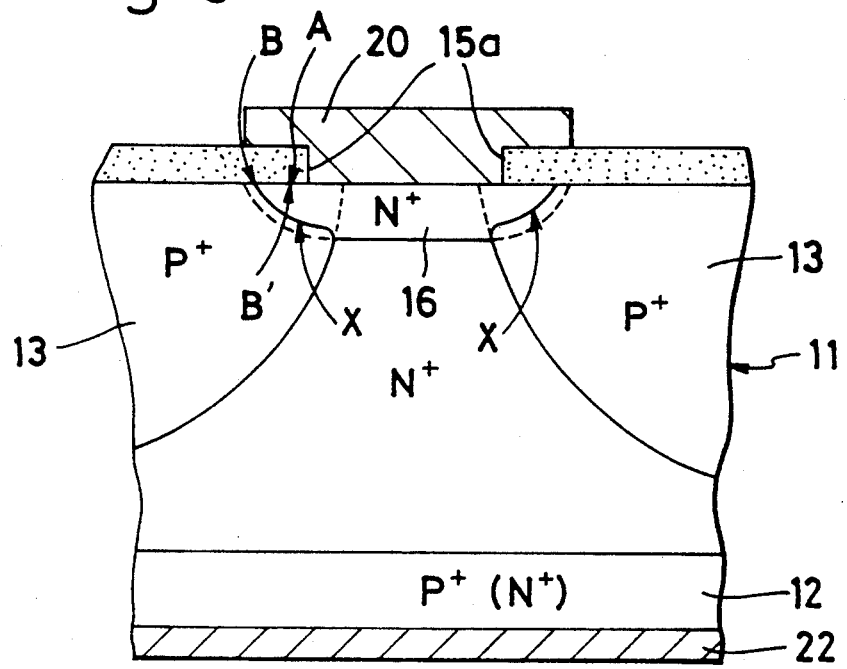
FIG. 3 shows more in detail the static induction type semiconductor device of the enhancement type as manufactured through the steps of FIG. 2.
Figure 4:
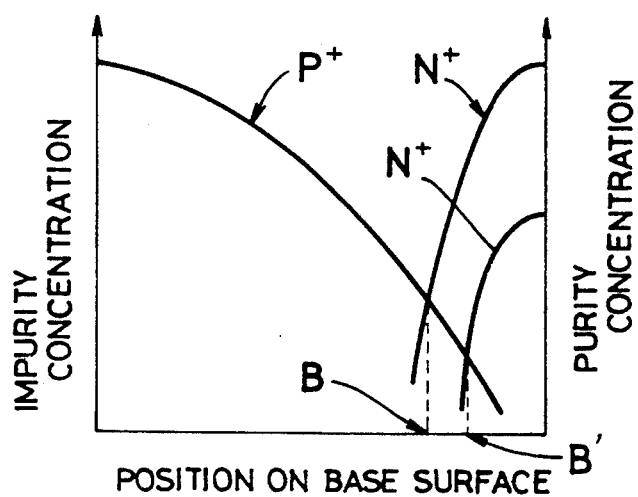
FIG. 4 is a diagram showing the impurity profile at the respective impurity diffusion zones constituting the gate and cathode zones in the enhancement type, static induction type semiconductor device of FIG. 3.

Thereafter, the cathode electrodes 20 and gate electrodes 21 are provided in the same steps as in FIG. 1 with respect to the impurity diffusion zones 16 constituting the cathode zones and the impurity diffusion zones 13 constituting the gate zones, respectively, with the oxide film 14 interposed, as shown in FIG. 2c, while the anode electrode 22 is provided with respect to the impurity diffusion zone 12 constituting the anode zone, and such enhancement type static induction thyristor as shown in FIG. 3 is thereby completed. In this enhancement type static induction thyristor of FIG. 3, the P-type and N-type impurities are made equal in the concentration at PN junction boundary between the impurity diffusion zones 13 constituting the gate zones and the impurity diffusion zones 16 constituting the cathode-zones. Referring to FIG. 4 showing the impurity profile measured adjacent a point A on the surface side of the substrate 11, it will be appreciated that an intersection of $P^+$-type and $N^+$-type impurity concentration curves in the diagraph of FIG. 4 corresponds to the PN junction boundary. In the case of known enhancement type static induction thyristor, the impurity diffusion zones constituting the cathode-zones show a remarkable fluctuation in the impurity profile so that, when the diffusion is shallow and the impurity concentration is low as shown in FIG. 3, the PN junction boundary will be at a position of B′, in which event the boundary becomes insufficient in the distance from the contact aperture 15a for forming the cathode electrode, so as to cause a risk to arise in that the gate and cathode zones may involve a short-circuit or at least a deficiency in the withstand voltage. In the enhancement type static induction thyristor according to the present invention, on the other hand, the impurity diffusion zones 16 constituting the cathode zones show only a small and stable fluctuation in the impurity concentration and diffusion depth, so that the PN junction boundary on the surface of the substrate 11 will be stably disposed at a position B in FIG. 3 as sufficiently separated from the cathode-electrode forming contact aperture 15a. Even when the contact apertures 15a are so formed as to partly overlap the impurity diffusion zones 13 constituting the gate zones, therefore, the junction boundary of these zones 13 with the impurity diffusion zones 16 constituting the cathode zones will be at a position X in FIG. 3 so as to be stably disposed at a position remote from the contact aperture 15a, whereby the reverse directional junction withstand voltage is made sufficient between the gate zones and the cathode zones so as to effectively prevent any short-circuit from occurring between them.

What is claimed is:

1. A method for manufacturing a static induction type semiconductor device for use as an enhancement mode power semiconductor device, the method comprising the steps of:

preparing a semiconductor substrate having impurity diffusion zones constituting gate zones on a surface side of said substrate and an oxide film covering said surface side, providing first apertures through said oxide film for forming impurity diffusion zones constituting cathode zones partly overlapping said impurity diffusion zones constituting the gates zones, forming said impurity diffusion zones constituting said cathode zones with an impurity diffused through said first apertures by means of a thermal diffusion, providing second apertures through said oxide film on said impurity diffusion zones constituting said gate zones, while leaving said oxide film as a thin oxide film produced to be less than about 50 Å within said first apertures during said thermal diffusion for said impurity diffusion zones constituting the cathode zones, said second apertures being for use as contact apertures allowing gate electrodes to contact said gate zones, forming third apertures by removing said thin oxide film produced within the first apertures through a slight etching and without any masking, said third apertures being thus formed for use as contact apertures allowing cathode electrodes to contact said cathode zones at the same positions and with the same size as the first apertures for forming the impurity diffusion zones constituting the cathode zones relying only on positioning precision of a required mask for forming the first apertures, forming said gate electrodes through said second apertures and said cathode electrodes through said third apertures respectively on the impurity diffusion zones constituting the gate zones and on the impurity diffusion zones constituting the cathode zones, and providing an anode electrode on an impurity diffusion zone constituting an anode zone formed on reverse side of the substrate.

2. The method according to claim 1 wherein said first apertures for forming said impurity diffusion zones constituting said cathode zones are formed to partly overlap said impurity diffusion zones constituting said gate zones.

* * * * *